United States Patent
Zhang

(10) Patent No.: US 9,252,250 B2
(45) Date of Patent: Feb. 2, 2016

(54) TUNNELING FIELD EFFECT TRANSISTOR (TFET) WITH ULTRA SHALLOW POCKETS FORMED BY ASYMMETRIC ION IMPLANTATION AND METHOD OF MAKING SAME

(71) Applicant: Taiwan Semiconductor Manufacturing Company, Ltd., Hsin-Chu (TW)

(72) Inventor: Ying Zhang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/712,736

(22) Filed: Dec. 12, 2012

(65) Prior Publication Data

US 2014/0158990 A1 Jun. 12, 2014

(51) Int. Cl.
*H01L 29/73* (2006.01)
*H01L 29/66* (2006.01)
*H01L 29/739* (2006.01)
*H01L 29/10* (2006.01)

(52) U.S. Cl.
CPC ........ *H01L 29/7311* (2013.01); *H01L 29/1045* (2013.01); *H01L 29/66356* (2013.01); *H01L 29/7391* (2013.01)

(58) Field of Classification Search
None
See application file for complete search history.

(56) References Cited

U.S. PATENT DOCUMENTS

| | | | |
|---|---|---|---|
| 6,133,079 A * | 10/2000 | Zhu et al. | 438/210 |
| 6,902,971 B2 | 6/2005 | Grudowski | |
| 7,646,039 B2 | 1/2010 | Zhu et al. | |
| 8,384,122 B1 * | 2/2013 | Hu et al. | 257/105 |
| 8,592,911 B2 | 11/2013 | Liang et al. | |
| 2002/0072180 A1 * | 6/2002 | Yugami et al. | 438/299 |
| 2003/0224617 A1 | 12/2003 | Baek et al. | |
| 2005/0275010 A1 * | 12/2005 | Chen et al. | 257/315 |
| 2006/0189080 A1 * | 8/2006 | Lee et al. | 438/261 |
| 2007/0045753 A1 * | 3/2007 | Pae et al. | 257/410 |
| 2009/0152650 A1 * | 6/2009 | Chudzik et al. | 257/410 |
| 2010/0038713 A1 * | 2/2010 | Majhi et al. | 257/344 |
| 2012/0228706 A1 * | 9/2012 | Sugizaki et al. | 257/345 |
| 2014/0170827 A1 | 6/2014 | Zhang | |

OTHER PUBLICATIONS

Patel, P. et al., "A Low Voltage Steep Turn-Off Tunnel Transistor Design," International Conference on Simulation of Semiconductor Processes and Devices ("SISPAD"), 2009, pp. 1-4.

Sterkel, M., et al., "Complementary Tunneling-Transistors (TFET): Fabrication and Application down to the 65 nm CMOS-node," SINANO Workshop: Nanoscale CMOS and emerging post-CMOS logic and memory nanodevices, Sep. 16, 2005, 27 pages.

* cited by examiner

*Primary Examiner* — Bilkis Jahan
*Assistant Examiner* — Kevin Quinto
(74) *Attorney, Agent, or Firm* — Slater & Matsil, L.L.P.

(57) ABSTRACT

An embodiment integrated circuit device and a method of making the same. The embodiment integrated circuit includes a substrate supporting a source with a first doping type and a drain with a second doping type on opposing sides of a channel region in the substrate, and a pocket disposed in the channel region, the pocket having the second doping type and spaced apart from the drain between about 2 nm and about 15 nm. In an embodiment, the pocket has a depth of between about 1 nanometer to about 30 nanometers.

20 Claims, 6 Drawing Sheets

TUNNELING FIELD EFFECT TRANSISTOR (TFET) WITH ULTRA SHALLOW POCKETS FORMED BY ASYMMETRIC ION IMPLANTATION AND METHOD OF MAKING SAME

BACKGROUND

Advances in the semiconductor industry have reduced the size of transistors in integrated circuits (ICs) to 32 nanometers and smaller. The decrease in transistor sizes leads to decreases in power supply voltage to the transistors. As the power supply voltage has decreased, the threshold voltage of the transistors in the ICs has also decreased.

Lower threshold voltages are difficult to obtain in a conventional metal-oxide-semiconductor field-effect transistor (MOSFET). Indeed, as the threshold voltage is reduced the ratio of on current to off current ($I_{on}/I_{off}$) also decreases. The on current refers to the current through the MOSFET when an applied gate voltage is above the threshold voltage, and the off current refers to current through the MOSFET when the applied gate voltage is below the threshold voltage.

The on current to off current ratio may be improved by using a tunneling field-effect transistor (TFET). The TFET takes advantage of band-to-band tunneling (BTBT) to increase the achievable on current ($I_{on}$), which permits further reductions in threshold voltage, power supply voltage, and transistor size. Unfortunately, forming the dopant pocket in the TFET is challenging.

BRIEF DESCRIPTION OF THE DRAWINGS

For a more complete understanding of the present disclosure, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of embodiments are discussed in detail below. It should be appreciated, however, that the present disclosure provides many applicable concepts that can be embodied in a wide variety of specific contexts. The specific embodiments discussed are merely illustrative, and do not limit the scope of the disclosure.

The present disclosure will be described with respect to embodiments in a specific context, namely a tunneling field effect transistor (TFET). The concept may also be applied, however, to other integrated circuits (e.g., a fin field effect transistor (FinFET), a planar metal-oxide-semiconductor field-effect transistor (MOSFET), a double-gate MOSFET, a tri-gate MOSFET, etc.) and electronic structures.

Figure 1:
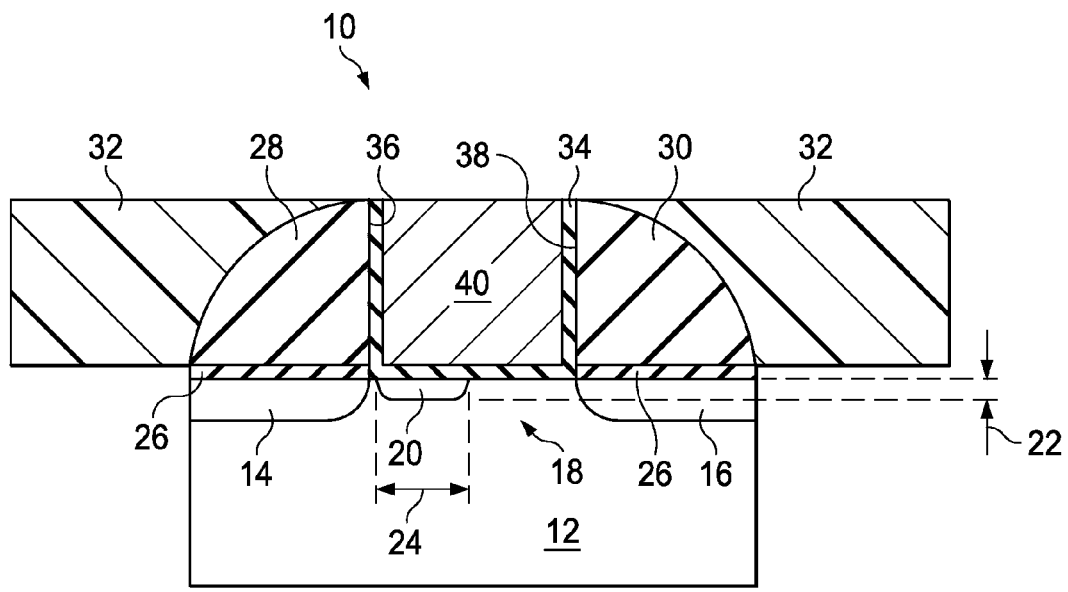
FIG. 1 is a cross section of an embodiment TFET having an ultra-shallow pocket formed in a channel region.

Referring now to FIG. 1, an embodiment TFET 10 is illustrated. As shown, the TFET 10 includes a substrate 12 supporting a source 14 with a first doping type (e.g., p-type) and a drain 16 with a second doping type (e.g., n-type) on opposing sides of a channel region 18 in the substrate 12. In an embodiment, the substrate 12 is formed from silicon, a silicon-containing material, an intrinsic silicon, and so on.

Still referring to FIG. 1, the TFET 10 also includes an ultra-shallow pocket 20 disposed in the channel region 18. As shown, the ultra-shallow pocket 20 has the second doping type (e.g., n-type) and is disposed closer to the source 14 than the drain 16. In an embodiment, the ultra-shallow pocket 20 is spaced apart from the drain 16 between about 2 nanometers and about 15 nanometers. In an embodiment, the channel region 18 containing the ultra-shallow pocket 20 is disposed in a fin of a FinFET device as opposed to the TFET 10 of FIG. 1. In other words, the ultra-shallow pocket 20 disclosed herein may be included in other types of integrated circuits.

The ultra-shallow pocket 20 permits band-to-band tunneling (BTBT) to occur within the TFET 10. In an embodiment, a first tunneling path exists between the source 14 and the ultra-shallow pocket 20 while a second tunneling path exists between the source 14 and the channel region 18.

In an embodiment, the ultra-shallow pocket 20 has a depth 22 of between about 1 nanometer (nm) and about 30 nm. In an embodiment, the ultra-shallow pocket 20 has a width 24 of between about 1 nm and about 15 nm. It should be recognized that such dimensions are dependent on design parameters of the TFET 10 and are not intended to be limiting. In other words, other dimensions are considered to be within the scope of the disclosure.

Still referring to FIG. 1, the TFET 10 includes a gate dielectric 26 (e.g., a gate oxide) disposed over the source 14 and the drain 16. The TEFT 10 also includes a first spacer 28 disposed over the source 14 and a second spacer 30 disposed over the drain 16. In an embodiment, the first spacer 28 and the second spacer 30 are each formed from silicon nitride or a silicon/nitrogen-containing compound (e.g., SiNx). As shown, a spin on resist layer 32 may abut the first spacer 28 and the second spacer 30 in the intermediate stage of manufacture illustrated in FIG. 1.

Still referring to FIG. 1, the TFET 10 further includes a high-k dielectric layer 34 (e.g., a high-k oxide). As used herein, the term high-k dielectric layer 34 refers to a dielectric having a dielectric constant, k, higher than the dielectric constant of silicon dioxide. As shown, the high-k dielectric layer 34 is disposed over a first sidewall 36 of the first spacer 28, over the ultra-shallow pocket 20, over the adjacent channel region 18, and over a second sidewall 38 of the second spacer 30. In an embodiment, the high-k dielectric layer 34 is formed from hafnium silicate, zirconium silicate, hafnium dioxide, and so on. In addition to the high-k dielectric layer 34, a metal gate stack 40 is disposed over the channel region 18. The high-k dielectric layer 34 and the metal gate stack 40 are generally disposed between the first spacer 28 and the second spacer 30.

Figure 2A:
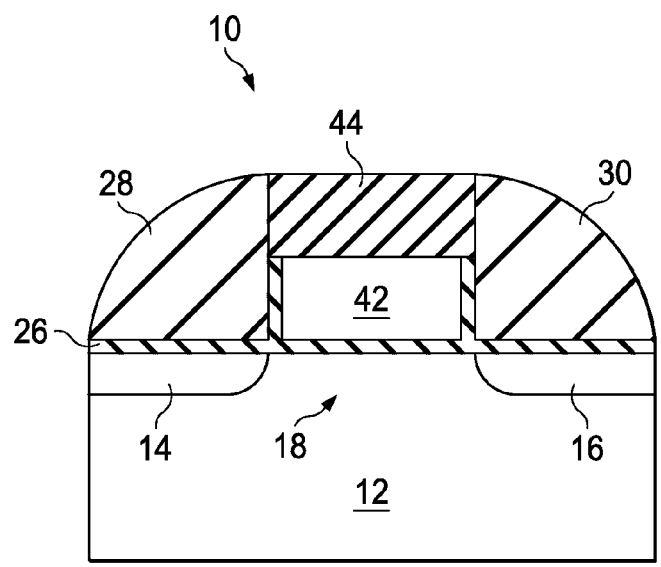
FIGS. 2a-2j collectively illustrate a method of forming the embodiment TFET of FIG. 1.

Referring now to FIGS. 2a-2j, an embodiment method of forming the TFET 10 of FIG. 1 is collectively illustrated. As shown in FIG. 2a, the method begins by forming the source 14 with the first doping type and the drain 16 with the second doping type in the substrate 12 on opposing sides of the channel region 18. Thereafter, the gate dielectric 26 is formed over the source 14, the channel region 18, and the drain 16. In addition, the first spacer 28 and the second spacer 30 are formed over the source 14 and the drain 16.

In an embodiment, the first spacer 28 and the second spacer 30 are formed using a low pressure chemical vapor deposition (LPCVD) technology, which works at rather high temperature and is done either in a vertical or in a horizontal tube furnace, or a plasma-enhanced chemical vapor deposition (PECVD) technology, which works at rather low temperature and vacuum conditions.

Still referring to FIG. 2a, a dummy gate 42 and a hard mask 44 are formed over the gate dielectric 26 between the first spacer 28 and the second spacer 30. In an embodiment, the dummy gate 42 is formed from a polysilicon. In an embodiment, the hard mask 44 is formed from an oxide, silicon dioxide, silicon nitride, or other suitable materials.

Figure 2B:
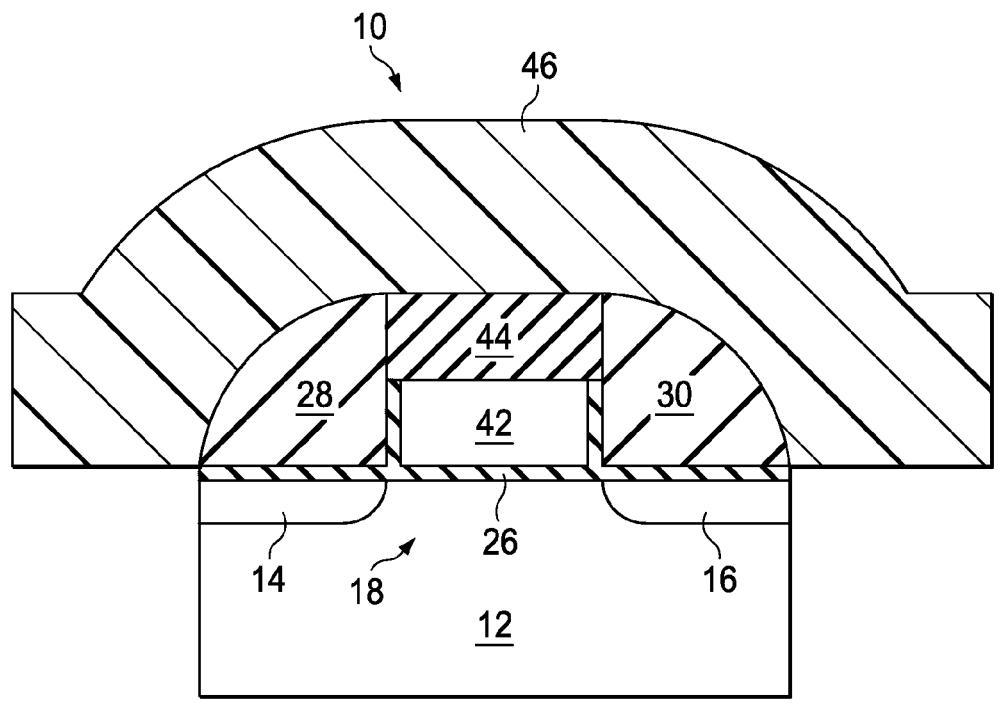
Figure 2C:
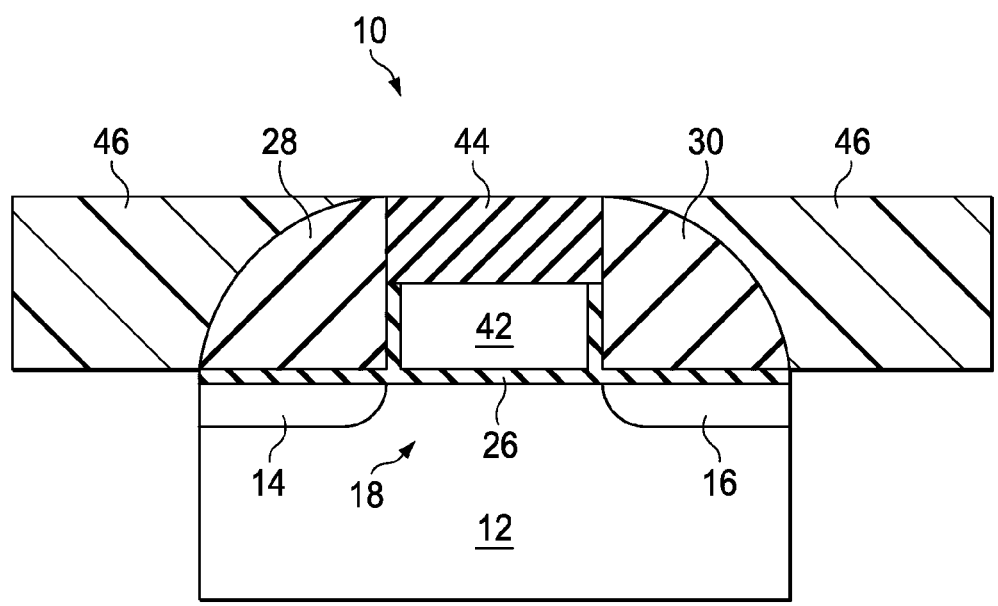

Referring now to FIG. 2b, a resist layer 46 is formed over the first spacer 28, the hard mask 44, and the second spacer 30. In an embodiment, the resist layer 46 is deposited using a spin-on process. Moving on to FIG. 2c, the resist layer 46 is recessed down to the hard mask 44. The resist layer 46 may be recessed using, for example, a wet etching process or a dry etching process.

Figure 2D:
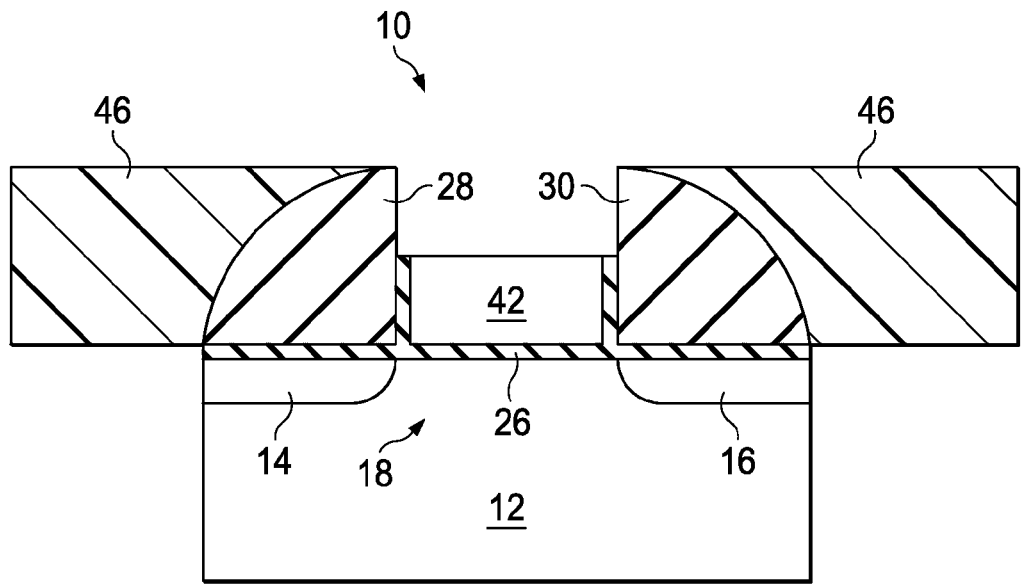
Figure 2E:
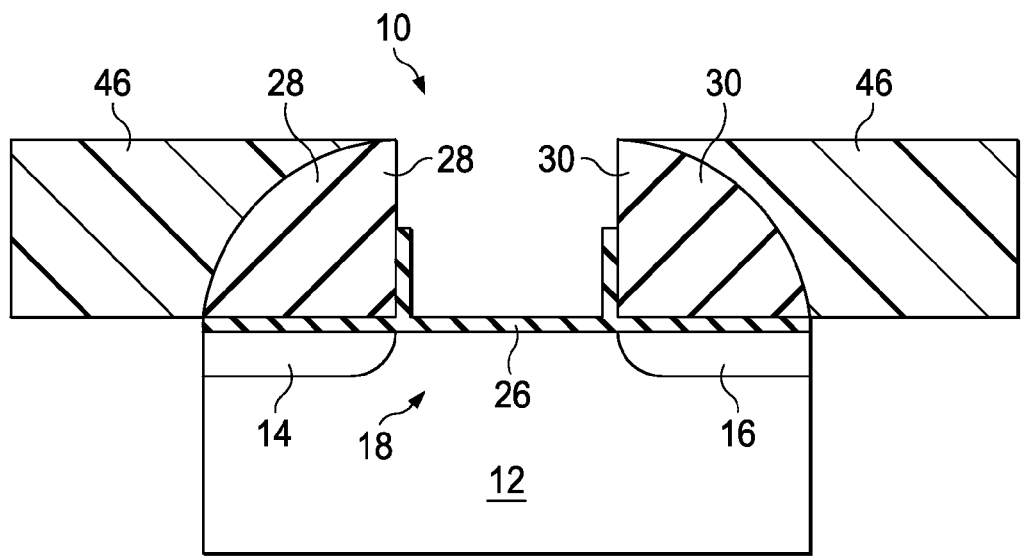

Referring now to FIG. 2d, the hard mask 44 is removed down to the dummy gate 42. In an embodiment, the hard mask 44 is removed using a dry plasma etching process, a chemical down-stream etching (CDE), or a combination thereof. Referring now to FIG. 2e, the dummy gate 42 is removed down to the gate dielectric 26. In an embodiment, the dummy gate 42 is removed using a dry plasma etching process, a chemical down-stream etching (CDE), or a combination thereof.

Figure 2F:
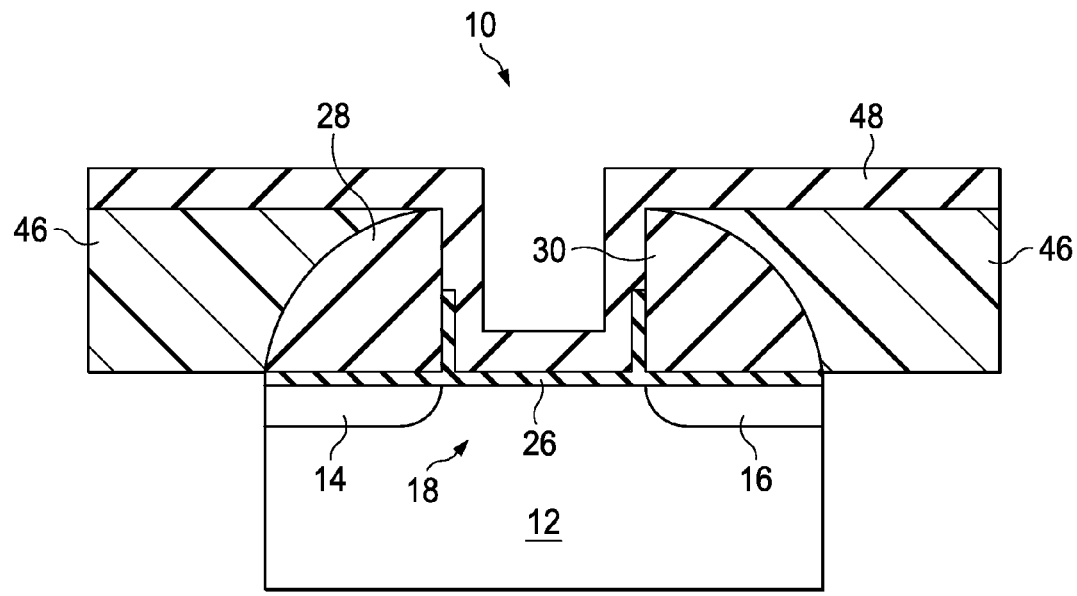
Figure 2G:
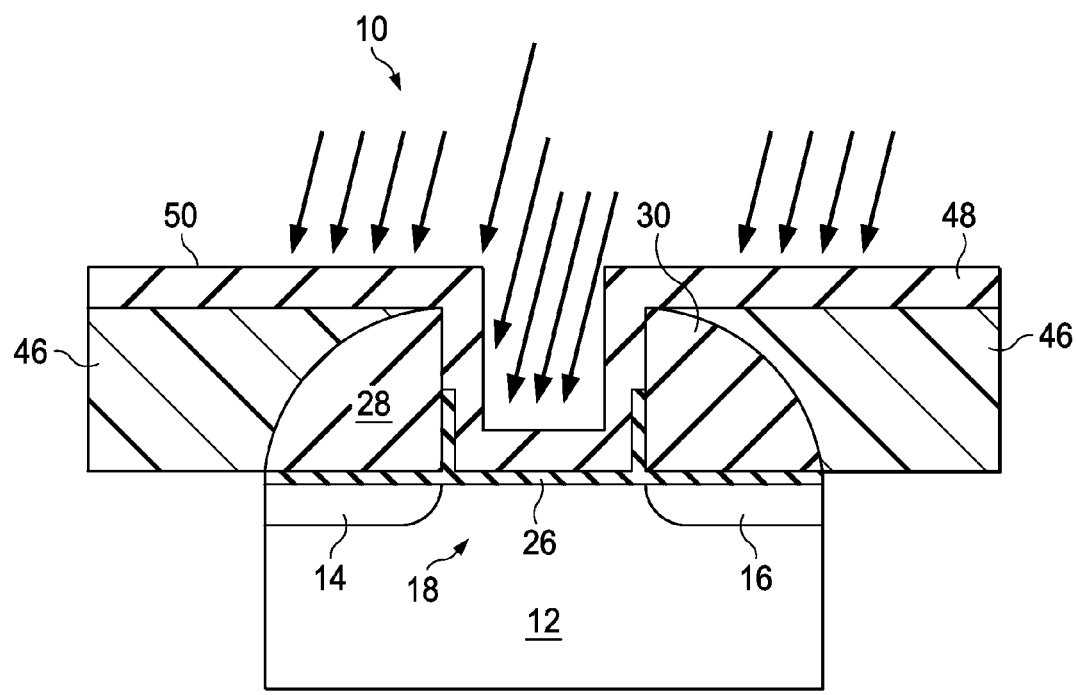

Referring now to FIG. 2f, a nitride layer 48 is formed over the resist layer 46, the first spacer 28, the gate dielectric 26, and the second spacer 30. In an embodiment, the nitride layer 48 is a low-temperature nitride film. Moving now to FIG. 2g, germanium ions (Ge+) are implanted in the nitride layer 48 (as indicated by the arrows). As shown, in an embodiment the germanium ions are implanted in a direction that forms an acute angle with a top surface 50 of the nitride layer 48.

Figure 2H:
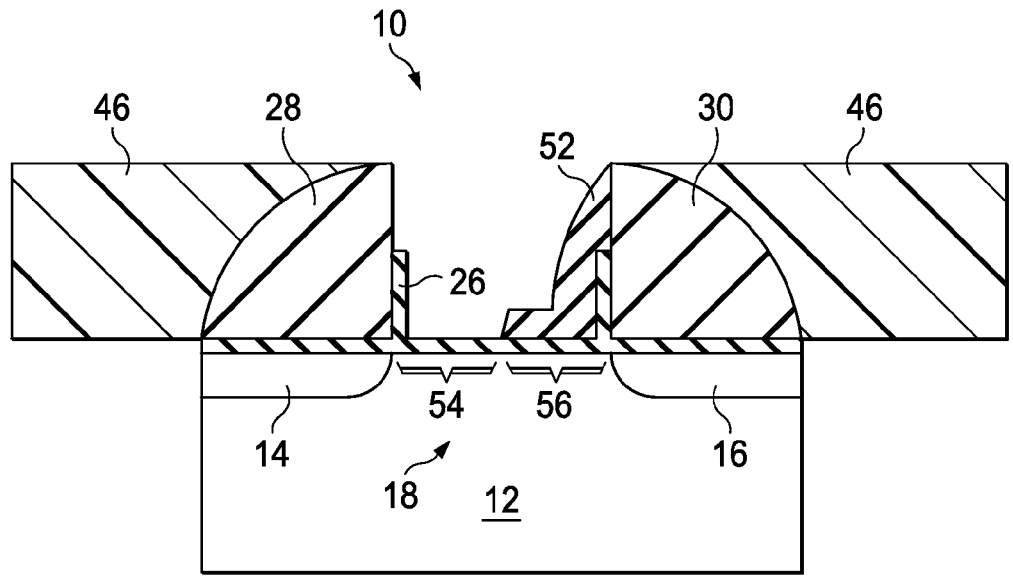

Referring now to FIG. 2h, the germanium-implanted portions of the nitride layer 48 (FIG. 2g) are removed to form the asymmetric low temperature nitride spacer 52. In an embodiment, the germanium-implanted portions of the nitride layer 48 are removed by a plasma etching process. In an embodiment, the germanium-implanted portions of the nitride layer 48 are selectively removed using fluoride (F), carbon (C), and/or hydrogen (H) containing plasmas such as, for example, mixtures of $CF_4/CHF_3$, $CH_2F_2$, $CH_3F$, Argon (Ar), and so on. The selectivity of ion implanted nitride film versus deposited nitride film may be 3:1 or higher due to the reactivity of F-bonding with more dangling bonds of $SiN_x$, i.e., amorphized nitride film. As shown in FIG. 2h, the asymmetric low temperature nitride spacer 52 leaves a first portion 54 of the channel region 18 generally unprotected or uncovered and protects or covers a second portion 56 of the channel region 18.

Figure 2I:
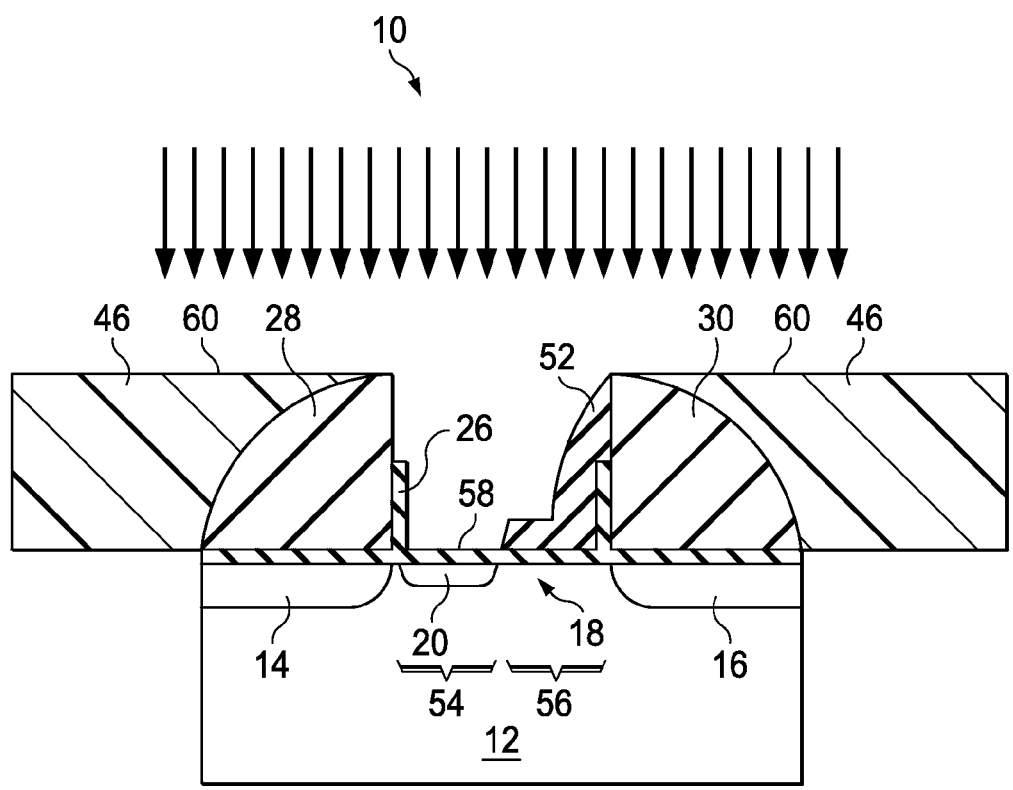

Referring now to FIG. 2i, n-type impurities (as indicated by the arrows) are implanted in the first portion 54 of the channel region 18. As shown in FIG. 2i, the n-type ion implantation process produces the ultra-shallow pocket 20 in the first portion 54 of the channel region 18, which was left unprotected by the asymmetric low temperature nitride spacer 52. The n-type impurities may be, for example, phosphorus, arsenic, antimony, or another suitable impurity. Unlike the implantation of germanium ions in FIG. 2g, the n-type impurities are implanted in a direction generally perpendicular to a top surface 58 of the gate dielectric 26 and/or a top surface 60 of the resist layer 46.

Figure 2J:
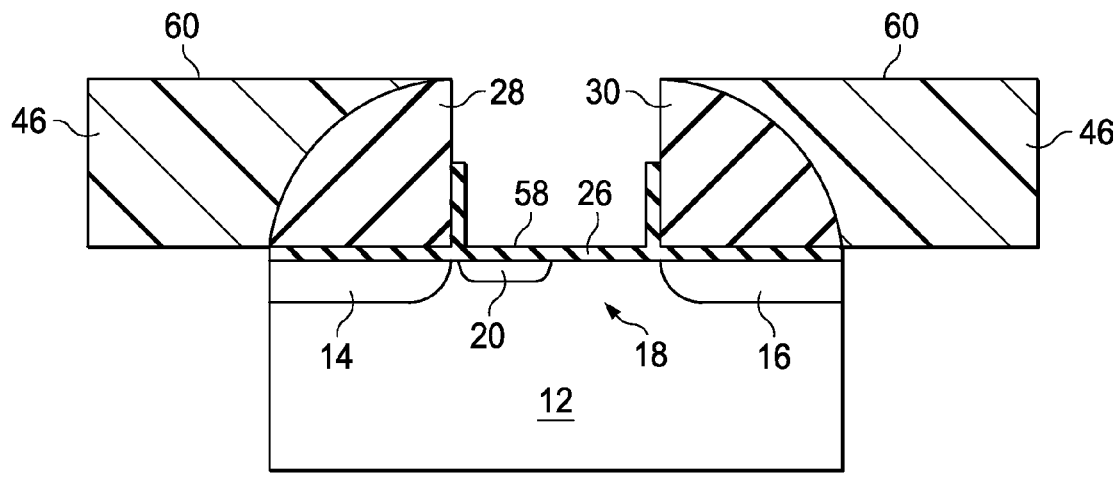

Referring now to FIG. 2j, the asymmetric low temperature nitride spacer 52, the remaining portions of the hard mask 44, and the gate dielectric 26 disposed over the channel region 18 are removed. In an embodiment, the remaining portions of the hard mask 44 and the gate dielectric 26 are removed using wet etching (e.g., diluted hydrofluoric acid (dHF) etching, etc.), chemical downstream etching (CDE), or dry etching (e.g., chemical oxide removal (COD), etc.). In an embodiment, the asymmetric low temperature nitride spacer 52 is removed using a plasma etching process. Thereafter, as shown in FIG. 1, the gate dielectric 26 is removed over the channel region 18. Next, the high-k dielectric layer 34 and the metal gate stack 40 are formed over the ultra-shallow pocket 20 and the second portion 56 of the channel region 18 and between the first spacer 28 and the second spacer 30 to form the TFET 10. In an embodiment, the high-k dielectric layer 34 is formed using an atomic level deposition (ALD) process.

Figure 3:
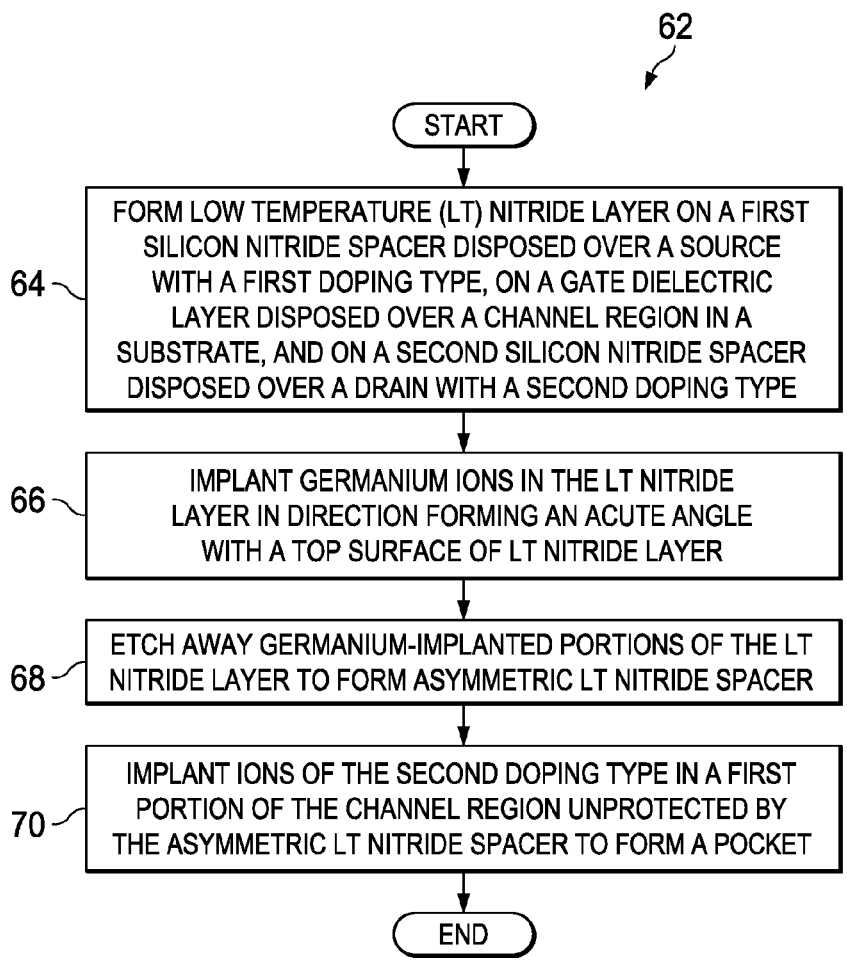
FIG. 3 illustrates an embodiment method of forming the TFET of FIG. 1.

Referring now to FIG. 3, an embodiment method 62 of forming an integrated circuit (e.g., the TFET 10 of FIG. 1) is provided. In block 64, a low temperature nitride layer is formed on a first silicon nitride spacer disposed over a source with a first doping type, on a gate dielectric layer disposed over a channel region in a substrate, and on a second silicon nitride spacer disposed over a drain with a second doping type. In block 66, germanium ions are implanted in the low temperature nitride layer in a direction forming an acute angle with a top surface of the low temperature nitride layer. In block 68, germanium-implanted portions of the low temperature nitride layer are etched away to form an asymmetric low temperature nitride spacer. In block 70, ions of the second doping type are implanted in a first portion of the channel region unprotected by the asymmetric low temperature nitride spacer to form a pocket.

The TFET 10 of FIG. 1 has several advantages relative to a conventional TFET. For example, the ultra-shallow pocket 20 of the TFET 10 is has a depth of between about 1 nm to about 30 nm. Due to the ultra-shallow pocket 20, the TFET 10 is able to operate below 0.5 Volts while maintaining a relatively large on current/off current ratio for this voltage. In addition, the ultra-shallow pocket 20 is self-aligning due to, for example, the process collectively illustrated in FIGS. 2a-2j. In addition, the TFET 10 having the ultra-shallow pocket 20 may be formed using a commercially-feasible manufacturing process.

An embodiment integrated circuit includes a substrate supporting a source with a first doping type and a drain with a second doping type on opposing sides of a channel region in the substrate, and a pocket disposed in the channel region, the pocket having the second doping type and spaced apart from the drain between about 2 nm and about 15 nm.

An embodiment integrated circuit includes a substrate supporting a source with a first doping type and a drain with a second doping type on opposing sides of a channel region in the substrate, a pocket disposed in the channel region, the pocket having the second doping type and a depth of between about 1 nm and about 30 nm, and a metal gate stack disposed over the channel region.

An embodiment method of forming an integrated circuit includes forming a low temperature nitride layer on a first silicon nitride spacer disposed over a source with a first doping type, on a gate dielectric layer disposed over a channel region in a substrate, and on a second silicon nitride spacer disposed over a drain with a second doping type, implanting germanium ions in the low temperature nitride layer in a direction forming an acute angle with a top surface of the low temperature nitride layer, etching away germanium-implanted portions of the low temperature nitride layer to form an asymmetric low temperature nitride spacer, and implanting ions of the second doping type in a first portion of the channel region unprotected by the asymmetric low temperature nitride spacer to form a pocket.

While the disclosure provides illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. An integrated circuit, comprising:
   a substrate comprising a source with a first doping type and a drain with a second doping type on opposing sides of a channel region in the substrate; and
   a pocket disposed in the channel region, a topmost surface of the pocket being substantially level with a topmost surface of the source and a topmost surface of the drain, the pocket having the second doping type and being spaced apart from the drain by a distance between about 2 nm and about 15 nm, wherein the pocket is disposed between the drain and an edge of the source closest to the drain, and wherein the source is spaced apart from the pocket.

2. The integrated circuit of claim 1, wherein the pocket has a depth of between about 1 nm and about 30 nm.

3. The integrated circuit of claim 1, wherein the pocket has a width of between about 1 nm and about 15 nm.

4. The integrated circuit of claim 1, wherein the channel region is disposed in a fin extending between the source and the drain.

5. The integrated circuit of claim 1, wherein a first silicon nitride spacer is disposed over the source and a second silicon nitride spacer is disposed over the drain.

6. The integrated circuit of claim 1, wherein a gate dielectric layer is disposed over each of the source and the drain.

7. The integrated circuit of claim 1, further comprising at least one of a high-k dielectric layer and a metal gate stack disposed over the channel.

8. The integrated circuit of claim 1, wherein the first doping type is a p-type and the second doping type is an n-type.

9. An integrated circuit, comprising:
   a substrate comprising a source with a first doping type and a drain with a second doping type on opposing sides of a channel region in the substrate;
   a pocket disposed in the channel region, a topmost surface of the pocket, a topmost surface of the source, and a topmost surface of the drain being level, the pocket having the second doping type and a depth of between about 1 nm and about 30 nm, wherein the pocket is disposed between the drain and an edge of the source closest to the drain, and wherein at least a portion of a material of the substrate separates the source from the pocket; and
   a metal gate stack disposed over the channel region.

10. The integrated circuit of claim 9, wherein the pocket is spaced apart from the drain between about 2 nm and about 15 nm.

11. The integrated circuit of claim 9, wherein the pocket has a width of between about 1 nm and about 15 nm.

12. The integrated circuit of claim 9, wherein the channel region is disposed in a fin extending between the source and the drain.

13. The integrated circuit of claim 9, wherein a first silicon nitride spacer is disposed over the source and a second silicon nitride spacer is disposed over the drain.

14. The integrated circuit of claim 13, wherein a high-k dielectric layer is disposed over the pocket, the channel region, a first sidewall of the first silicon nitride spacer, and a second sidewall of the second silicon nitride spacer.

15. The integrated circuit of claim 13, wherein a gate dielectric layer is disposed between the source and the first silicon nitride spacer and between the drain and the second silicon nitride spacer.

16. An integrated circuit, comprising:
   a substrate supporting a source with a first doping type and a drain with a second doping type on opposing sides of a channel region of a fin extending between the source and the drain, a topmost surface of the source being substantially level with a topmost surface of the drain;
   a pocket disposed in the channel region, the pocket spaced apart from the drain and having the second doping type, wherein the pocket is disposed between the drain and an edge of the source closest to the drain, and wherein the pocket does not overlap the source; and
   a metal gate stack disposed over the channel region.

17. The integrated circuit of claim 16, wherein the pocket has a depth of less than about 30 nm and the pocket has a width of between about 1 nm and about 15 nm.

18. The integrated circuit of claim 16, wherein source and the pocket are configured to provide a first tunneling path and the source and the channel region are configured to provide a second tunneling path.

19. The integrated circuit of claim 16, wherein a gate dielectric is interposed between the source and a first spacer and between the drain and a second spacer.

20. The integrated circuit of claim 16, wherein the pocket has a width and a depth less than that of the source and the drain.

* * * * *